US010649569B2

(12) United States Patent
Park et al.

(10) Patent No.: US 10,649,569 B2
(45) Date of Patent: May 12, 2020

(54) DISPLAY DEVICE

(71) Applicant: SAMSUNG DISPLAY CO., LTD., Yongin-si, Gyeonggi-do (KR)

(72) Inventors: Yong-Hwan Park, Yongin-si (KR); Mi Young Kim, Yongin-si (KR); Chi Wook An, Yongin-si (KR); Seong Jun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/257,283

(22) Filed: Jan. 25, 2019

(65) Prior Publication Data

US 2019/0155435 A1 May 23, 2019

Related U.S. Application Data

(63) Continuation of application No. 14/882,489, filed on Oct. 14, 2015, now Pat. No. 10,198,103.

(30) Foreign Application Priority Data

Apr. 16, 2005 (KR) .................. 10-2015-0054016

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *H01L 27/323* (2013.01); *H01L 51/5256* (2013.01); *G06F 2203/04103* (2013.01)

(58) Field of Classification Search
CPC ...... G06F 3/0411; G06F 3/0412; G06F 3/044; G06F 2203/04103; H01L 27/32; H01L 27/323; H01L 51/52; H01L 51/5256
See application file for complete search history.

(56) References Cited

U.S. PATENT DOCUMENTS

2005/0116240 A1* 6/2005 Kim .................... H01L 27/3244
257/88
2005/0242348 A1* 11/2005 Oh ......................... H01L 29/04
257/59
(Continued)

FOREIGN PATENT DOCUMENTS

CN 103258968 B 5/2016
KR 10-2010-0061121 A 6/2010
(Continued)

*Primary Examiner* — Vinh T Lam
(74) *Attorney, Agent, or Firm* — Lewis Roca Rothgerber Christie LLP

(57) ABSTRACT

A display device, including a substrate; a pixel electrode and an opposing electrode on the substrate; an encapsulation portion on the opposing electrode, the encapsulation portion including at least one organic layer and at least one inorganic layer alternately deposited; and a planarization layer on the encapsulation portion, the planarization layer including a portion covering an edge portion of the encapsulation portion, a first angle between an edge side surface of the planarization layer and a surface of the substrate being larger than a second angle between an edge side surface of the encapsulation portion and the surface of the substrate.

20 Claims, 7 Drawing Sheets

(51) Int. Cl.
*H01L 27/32* (2006.01)
*H01L 51/52* (2006.01)

(56) References Cited

U.S. PATENT DOCUMENTS

| | | | | |
|---|---|---|---|---|
| 2008/0265759 | A1* | 10/2008 | Young | H01L 51/5203 313/504 |
| 2008/0315756 | A1* | 12/2008 | Jeon | H01L 27/3246 313/504 |
| 2010/0295033 | A1* | 11/2010 | Rokuhara | H01L 27/3246 257/40 |
| 2011/0272695 | A1* | 11/2011 | Striakhilev | H01L 51/5234 257/57 |
| 2014/0002410 | A1* | 1/2014 | Lillie | G06F 3/041 345/174 |
| 2014/0009711 | A1* | 1/2014 | Tomioka | G02F 1/134363 349/43 |
| 2014/0367655 | A1 | 12/2014 | Takii | |
| 2016/0093685 | A1* | 3/2016 | Kwon | H01L 51/5237 257/40 |

FOREIGN PATENT DOCUMENTS

| | | |
|---|---|---|
| KR | 10-2012-0060926 A | 6/2012 |
| KR | 10-2013-0008745 A | 1/2013 |
| KR | 10-2011-0085794 A | 3/2013 |
| KR | 10-2014-0056498 A | 5/2014 |

* cited by examiner

DISPLAY DEVICE

CROSS-REFERENCE TO RELATED APPLICATIONS

This is a continuation application based on pending application Ser. No. 14/882,489, filed Oct. 14, 2015, the entire contents of which is hereby incorporated by reference.

Korean Patent Application No. 10-2015-0054016, filed on Apr. 16, 2015, in the Korean Intellectual Property Office, and entitled: "Display Device," is incorporated by reference herein in its entirety.

BACKGROUND

1. Field

Embodiments relate to a display device.

2. Description of the Related Art

Display devices such as a liquid crystal display (LCD), an organic light emitting diode (OLED) display, and an electrophoretic display may include a field generating electrode and an electro-optical active layer. For example, the organic light emitting diode (OLED) display device may include a liquid crystal layer as the electro-optical active layer. The field generating electrode may be connected to a switching element such as a thin film transistor to receive a data signal, and the electro-optical active layer may convert the data signal into an optical signal to display an image.

SUMMARY

Embodiments may be realized by providing a display device, including a substrate; a pixel electrode and an opposing electrode on the substrate; an encapsulation portion on the opposing electrode, the encapsulation portion including at least one organic layer and at least one inorganic layer alternately deposited; and a planarization layer on the encapsulation portion, the planarization layer including a portion covering an edge portion of the encapsulation portion, a first angle between an edge side surface of the planarization layer and a surface of the substrate being larger than a second angle between an edge side surface of the encapsulation portion and the surface of the substrate.

The planarization layer may include an organic material.

The organic layer included in the encapsulation portion may be covered by the inorganic layer.

The first angle may be equal to or more than about 70 degrees.

An upper surface of the planarization layer may be entirely flat.

The display device may further include a pattern on the planarization layer.

The substrate may include a display area for displaying an image and a peripheral area outside the display area, and the pattern may include a portion in the peripheral area.

The edge portion of the encapsulation portion may include a region having an upper surface a height of which is gradually decreased.

The edge side surface of the planarization layer may include a portion that is substantially curved.

The edge side surface of the planarization layer may be substantially flat.

The planarization layer may expose a portion of the encapsulation portion.

Upper surfaces of the encapsulation portion and the planarization layer may be entirely flat.

The organic layer included in the encapsulation portion may be covered by the inorganic layer.

The first angle may be equal to or more than about 70 degrees.

The display device may further include a pattern on the planarization layer.

The edge side surface of the planarization layer may include a portion that is substantially curved.

The edge side surface of the planarization layer may be substantially flat.

The planarization layer may expose a portion of the encapsulation portion.

The display device may further include a touch electrode or a touch wiring on the planarization layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
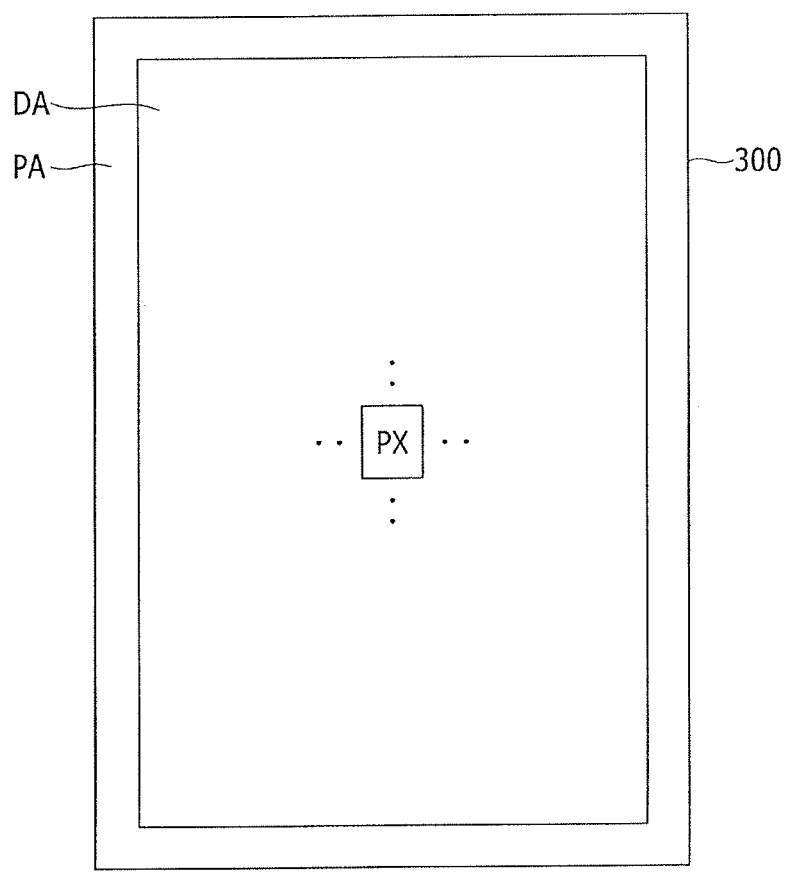
FIG. 1 illustrates a block diagram of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., may be exaggerated for clarity. Like reference numerals designate like elements throughout the specification. Portions having no relation to the description may be omitted in order to more clearly explain embodiments.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Now, a display device according to an exemplary embodiment will be described with reference to the accompanying drawings.

Figure 2:
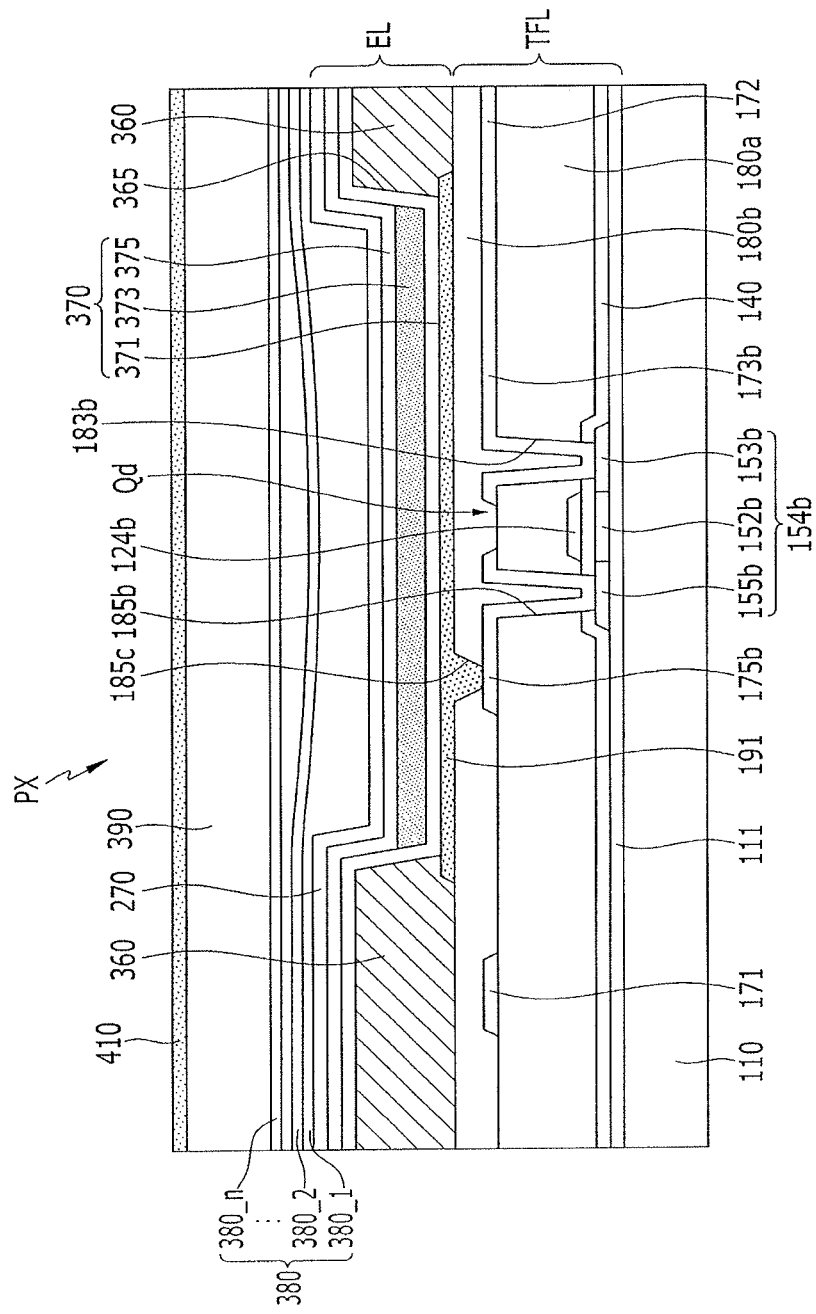
FIG. 2 illustrates a cross-sectional view of one pixel of a display device according to an exemplary embodiment.
Figure 3:
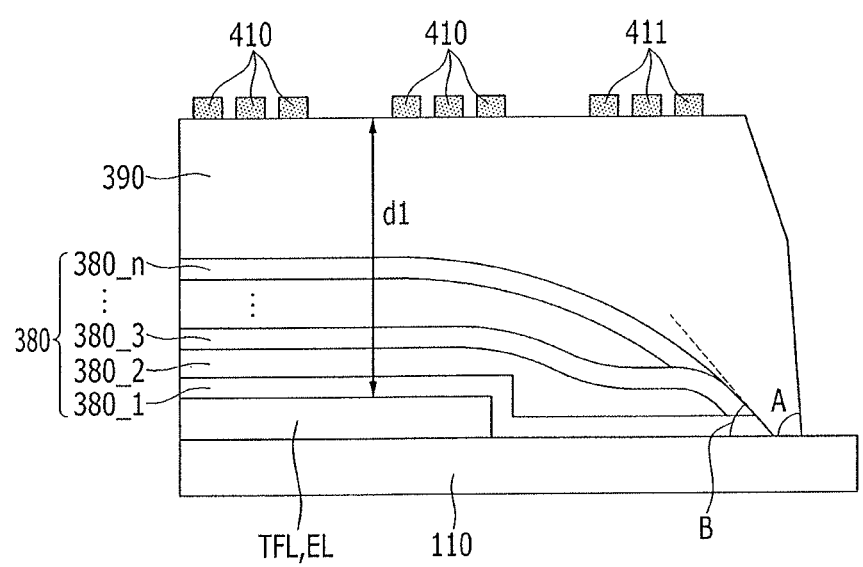
FIG. 3 illustrates a schematic cross-sectional view of a display device according to an exemplary embodiment.

FIG. 1 illustrates a block diagram of a display device according to an exemplary embodiment, FIG. 2 illustrates a cross-sectional view of one pixel of a display device according to an exemplary embodiment, and FIG. 3 illustrates a schematic cross-sectional view of a display device according to an exemplary embodiment.

Referring to FIG. 1, a display device according to an exemplary embodiment may include a display panel 300. A plan view of the display panel 300 may illustrate a display area DA for displaying an image and a peripheral area PA positioned outside the display area DA. A plurality of pixels PX and a plurality of display signal lines, which may be connected thereto in order to transfer driving signals, may be positioned in the display area DA.

The display signal lines may include a plurality of gate signal lines for transferring gate signals and a plurality of data lines for transferring data signals. The gate lines and the data lines may extend to cross each other. The display signal lines may extend to the peripheral area and form a pad unit.

In an embodiment, the pixels PX may be arranged substantially in a matrix form. Each of the pixels PX may include at least one switching element connected to a gate line and a data line, and a pixel electrode connected thereto. The switching element may be a three-terminal element such as a thin film transistor that may be integrated in the display panel 300. At least one switching element included in each pixel PX may be turned on or off according to a gate signal transferred through the gate line to selectively transfer a data signal transferred through the data line to the pixel electrode.

In order to implement a color display, each pixel PX may display one primary color, and a desired color may be recognized by combining primary colors. Examples of primary colors may include three or four primary colors, such as, for example, red, green, and blue.

Next, a detailed structure of the display device according to an exemplary embodiment will be described with reference to FIG. 2 and FIG. 3, as well as FIG. 1.

FIG. 2 illustrates a detailed cross-sectional view of the pixel PX of the display device, and FIG. 3 illustrates an entire cross-sectional view including the display area DA and the peripheral area PA of the display device.

The display device according to an exemplary embodiment may include a substrate 110. The substrate 110 may be comprised of, e.g., include, for example, glass or plastic. The substrate 110 may have flexibility, in which case, the substrate 110 may be comprised of, e.g., include, various plastics such as polyethylene terephthalate (PET), polyethylene naphthalate (PEN), polycarbonate (PC), polyisopropylidenediphenylene terephthalate/isophthalate copolymer (PAR), polyetherimide (PEI), polyether sulfone (PES), or polyimide (PI), a metal thin film, or a thin film glass.

A barrier layer 111 may be positioned on the substrate 110. The barrier layer 111 may prevent an impurity from the outside from passing through the substrate 110 and permeating into an upper side, and the surface thereof may be flat. The barrier layer 111 may include at least one inorganic layer and an organic layer. For example, the barrier layer 111 may include silicon nitride ($SiN_x$), silicon oxide ($SiO_x$), and silicon oxynitride ($SiO_xN_y$). The barrier layer 111 may be omitted.

A plurality of semiconductors 154b may be positioned on the barrier layer 111. The semiconductor 154b may include a channel region 152b, and a source region 153b and a drain region 155b positioned at both sides of the channel region 152b and formed by doping. The semiconductor 154b may include amorphous silicon, polysilicon, or oxide semiconductor.

A gate insulating layer 140 formed of, for example, silicon nitride ($SiN_x$) or silicon oxide ($SiO_x$), may be formed on the semiconductor 154b.

A plurality of gate conductors including a plurality of gate signal lines and gate electrodes 124b may be formed on the gate insulating layer 140. The gate electrode 124b may overlap a part of the semiconductor 154b, for example, the channel region 152b.

A first passivation layer 180a may be positioned on the gate insulating layer 140 and the gate conductor. The first passivation layer 180a and the gate insulating layer 140 may include a contact hole 183b through which the source region 153b of the semiconductor 154b may be exposed, and a contact hole 185b through which the drain region 155b may be exposed.

A plurality of data conductors including a plurality of data lines 171, a plurality of input electrodes 173b, and a plurality of output electrodes 175b may be positioned on the first passivation layer 180a. The data line 171 may transmit a data signal and may cross the scan signal line. The input electrode 173b may be connected to the data line 171. The output electrode 175b may be separated from the data line 171. The input electrode 173b and the output electrode 175b may face each other above the semiconductor 154b.

The input electrode 173b and the output electrode 175b may be connected with the source region 153b and the drain region 155b of the semiconductor 154b through the contact holes 183b and 185b, respectively.

The gate electrode 124b, the input electrode 173b, and the output electrode 175b may form a driving thin film transistor Qd together with the semiconductor 154b. In an embodiment, a structure of the driving thin film transistor Qd may be variously changed.

A second passivation layer 180b formed of an inorganic insulating material, such as silicon nitride or silicon oxide, may be positioned on the data conductor. The second passivation layer 180b may have a contact hole 185c through which the output electrode 175b may be exposed.

A plurality of pixel electrodes 191 may be formed on the second passivation layer 180b.

The pixel electrode 191 of each pixel PX may be physically and electrically connected with the output electrode 175b through the contact hole 185c of the second passivation layer 180b. The pixel electrode 191 may include a transflective conductive material or a reflective conductive material.

For convenience, the layers on the substrate 110, i.e., the layers from the barrier layer 111 to the second passivation layer 180b, are together referred to as a transistor layer TFL.

A pixel defining layer (also referred to as a partition wall) 360 having a plurality of openings through which the pixel electrode 191 may be exposed may be positioned on the second passivation layer 180b. The openings of the pixel defining layer 360 through which the pixel electrode 191 may be exposed may define a unit display area in which the light may be emitted in each pixel PX. The pixel defining layer 360 may be omitted.

An emission member 370 may be positioned on the pixel defining layer 360 and the pixel electrode 191. The emission member 370 may include a first organic common layer 371, a plurality of emission layers 373, and a second organic common layer 375, which may be sequentially stacked.

The first organic common layer 371 may include, for example, at least one of a hole injecting layer and a hole transport layer, which may be sequentially stacked. The first organic common layer 371 may be formed over an entire surface of the display area in which the pixels PX may be disposed, and may be formed only in the area of each pixel PX.

The emission layers 373 may be respectively positioned on the pixel electrodes 191 of the corresponding pixels PX. The emission layer 373 may be formed of an organic material uniquely emitting light of primary colors, such as red, green, and blue, or may have a structure in which a plurality of organic material layers emitting light of different colors may be stacked.

The second organic common layer 375 may include, for example, at least one of an electron transport layer and an electron injecting layer, which may be sequentially stacked. The second organic common layer 375 may be formed over an entire surface of the display area in which the pixels PX may be disposed, and may be formed only in the area of each pixel PX.

The first and second organic common layers 371 and 375 may improve light emission efficiency of the emission layer 373, and one of the first and second organic common layers 371 and 375 may be omitted.

An opposing electrode 270 transmitting a common voltage may be positioned on the emission member 370. The opposing electrode 270 may include a transparent conductive material. For example, the opposing electrode 270 may be formed of a transparent conductive material, or may be formed by thinly stacking a metal, such as calcium (Ca), barium (Ba), magnesium (Mg), aluminum (Al), or silver (Ag), thereby having a light transmitting characteristic.

The pixel electrode 191, the emission member 370, and the opposing electrode 270 of each pixel PX may form a light emitting diode, and one of the pixel electrode 191 and the opposing electrode 270 may serve as a cathode, while the other may serve as an anode.

For convenience, the pixel definition layer 360 and the layers from the pixel electrode 191 to the opposing electrode 270 are together referred to as a light-emitting device layer EL.

The display device according to the exemplary embodiment may be a top emission type, which upwardly may emit internal light from the emission member 370 and may display an image.

An encapsulation portion 380 may be positioned on the opposing electrode 270. The encapsulation portion 380 may prevent moisture and/or oxygen from passing through from the outside by encapsulating the emission member 370 and the opposing electrode 270.

The encapsulation portion 380 may include a plurality of encapsulating thin film layers 380_1, 380_2, 380_3, . . . 380_$n$. The encapsulating thin film layers 380_1, 380_2, 380_3, . . . 380_$n$ may include at least one inorganic layer and at least one organic layer, and the organic layer and the inorganic layer may be alternately deposited. The organic layer may include organic material and may have a flat characteristic. The inorganic layer may include inorganic material such as aluminum oxide ($AlO_x$), silicon oxide ($SiO_x$), and silicon nitride ($SiN_x$).

In FIG. 2, the lowest encapsulating thin film layer 380_1 among the encapsulating thin film layers 380_1, 380_2, 380_3, . . . 380_$n$ may be the inorganic layer and may be the organic layer. The highest encapsulating thin film layer 380_$n$ in the encapsulating thin film layers 380_1, 380_2, 380_3, . . . 380_$n$ may also be the inorganic layer or the organic layer. When the highest encapsulating thin film layer 380_$n$ is the inorganic layer, moisture may be further prevented from penetrating the encapsulation portion 380. The inorganic layer included in the encapsulation portion 380 may cover the underlying organic layer in order to not expose the organic layer outside. The organic layer included in the encapsulation portion 380 may be covered by the inorganic layer, the encapsulation portion 380 may not be exposed to the outside, and moisture penetration from the outside through the organic layer may be blocked.

In most of the display area DA, the upper surface of the encapsulation portion 380 including the plurality of encapsulating thin film layers 380_1, 380_2, 380_3, . . . , 380_$n$ may be substantially flat.

Referring to FIG. 3, the edge portion of the encapsulation portion 380 may be thinner toward the edge of the display device, and the upper surface of the encapsulation portion 380 may gradually become lower. As shown in FIG. 3, the edge portion of the encapsulation portion 380, the upper surface of which may gradually become lower, may be formed throughout the edge of the display area DA and the peripheral area PA and may be mainly positioned in the peripheral area PA. The upper surface of the encapsulation portion 380 may gradually become lower from the edge region of the display area DA adjacent to the vicinity of the boundary of the peripheral area PA and the display area DA toward the outside, or may gradually become lower from the inside of the peripheral area PA toward the outside.

The thickness of the encapsulation portion 380 may also be decreased in the portion, e.g., region, where the height of the upper surface of the encapsulation portion 380 is decreased. As described above, the upper surface of the edge portion in which the thickness of the encapsulation portion 380 gradually decreases may not be facing upward and may be toward the side such that it may be referred to as a side surface of the encapsulation portion 380. In an embodiment, the side surface of the encapsulation portion 380 may be formed of a curved surface.

At the end of the encapsulation portion 380, the side surface of the encapsulation portion 380 may meet the surface of the substrate 110, and the side surface of the encapsulation portion 380 or an imaginary surface contacting the side surface may form an acute angle B with the surface of the substrate 110, for example, the angle B may be less than 45 degrees, and furthermore, may be less than about 20 degrees. The edge portion of the encapsulation portion 380 may form a gradual profile.

A planarization layer 390 may be positioned on the encapsulation portion 380. The planarization layer 390 may be formed on the entire surface of the encapsulation portion 380 or only on part. The planarization layer 390 may include at least a portion covering the edge portion where the height of the upper surface of the encapsulation portion 380 may gradually decrease. FIG. 2 and FIG. 3 illustrate an example where the planarization layer 390 may be substantially formed on the entire surface of the encapsulation portion 380.

The planarization layer 390 may include organic material. The organic material included in the planarization layer 390 may include the same material as the organic material of the organic layer included in the encapsulation portion 380 or another organic material. The organic material included in the planarization layer 390 may be the same as the organic material of the organic layer included in the encapsulation portion 380. In an embodiment, the organic material included in the planarization layer 390 may have different viscosity.

The angle A formed by most of the side surface of the edge of the planarization layer 390 and the surface of the substrate 110 may be larger than the angle B formed by the side surface of the encapsulation portion 380 and the substrate 110. The profile of the edge portion of the planarization layer 390 may be formed sharper than the profile of the edge portion of the encapsulation portion 380. For example, the angle A between the edge side surface of the planarization layer 390 and the surface of the substrate 110 may be equal to or more than about 70 degrees, almost 90 degrees. As described above, by vertically forming the edge side surface of the planarization layer 390 with the surface of the substrate 110, the flattened area of the upper surface of the planarization layer 390 may be maximized.

In an embodiment, the edge side surface of the planarization layer 390 may be positioned in the peripheral area PA.

Referring to FIG. 3, the edge side surface of the planarization layer 390 may be substantially flat and may include the portion that is curved or bent.

The planarization layer 390 may be formed on the encapsulation portion 380 by using a screen printing method or a photolithography process using a photosensitive organic material.

According to an exemplary embodiment, the planarization layer 390 including the organic material may include the portion that may be exposed to the outside, and moisture penetration may occur, however, the encapsulation portion 380 may be positioned under the planarization layer 390, and reliability failure, for example, due to moisture penetration, may be prevented. Most of the organic layer included in the encapsulation portion 380 may be covered by the inorganic layer, and although moisture penetration may occurs through the planarization layer 390, moisture penetration may not reach the light-emitting device layer EL through the encapsulation portion 380.

In an embodiment, in the display area DA, the total thickness dl of the encapsulation portion 380 and the planarization layer 390 may be equal to or more than about 10 um.

Referring to FIG. 3, a plurality of patterns may be positioned on the planarization layer 390. The plurality of patterns may be a pattern of touch sensors that may sense a touch from the outside. A touch may include the case in which an external object approaches the touch surface of the display device or hovers in an approached state, as well as a case in which an external object such as a finger of the user directly contacts the touch surface of the display device. The pattern of touch sensors may include a touch electrode 410 and a touch wiring 411 connected thereto. The touch electrode 410 may be mainly positioned in the display area DA. In an embodiment, the touch electrode 410 may be positioned in the peripheral area PA. The touch wiring 411 may be mainly positioned in the peripheral area PA. In an embodiment, the touch wiring 411 may include the portion positioned in the display area DA. As such, a touch sensor directly formed on the upper surface of the display device is referred to as an on-cell type touch sensor.

According to an exemplary embodiment, as described above, the side surface of the edge portion of the planarization layer 390 may form a sharp incline for the surface of the substrate 110, the flattened area of the upper surface of the planarization layer 390 may be maximized, and the area capable of forming the plurality of patterns may be maximized in the planarization layer 390.

If the planarization layer 390 is not formed, the plurality of patterns may be formed on the upper surface of the encapsulation portion 380 and the profile of the edge portion of the encapsulation portion 380 may be smooth, and there may be no choice but to form the pattern on only the flattened upper surface of the encapsulation portion 380 to prevent pattern failure. Accordingly, it may be difficult to form the pattern at the edge portion of the display area DA, and the region for forming the pattern such as the touch sensor may be limited. Thus, the dead space in which a touch is not sensed in the display device may be increased. However, according to an exemplary embodiment, the flattened upper surface in which the smooth profile portion of the encapsulation portion 380 may be covered by the planarization layer 390 may be maximized and the upper surface of the planarization layer 390 may be flattened in most of the peripheral area PA. Accordingly, the area in which the pattern such as the touch sensor may be formed may be sufficiently ensured and the area of the dead space may be reduced. Accordingly, the bezel of the display device may be reduced, and customer satisfaction may be increased.

Parasitic capacitance may be generated between the opposing electrode 270 positioned in the light-emitting device layer EL and the pattern of the touch sensor, and if parasitic capacitance increases, the characteristic of the touch sensor may be influenced. When the pattern of the touch sensor is directly formed on the encapsulation portion 380 without the planarization layer 390, the pattern of the touch sensor formed at the edge portion of the encapsulation portion 380 may increase the parasitic capacitance between the opposing electrode 270 and the pattern of the touch sensor. To prevent this, the pattern of the touch sensor may only be formed on the flat upper surface of the encapsulation portion 380, and dead space may increase more. However, according to an exemplary embodiment, the planarization layer 390 may be formed on the encapsulation portion 380, parasitic capacitance may be reduced between the opposing electrode 270 and the pattern, and the touch sensitivity of the touch sensor consisting of the pattern may be increased and the area of dead space may be simultaneously reduced.

Next, an example of the pattern formed on the planarization layer 390 will be described with reference to FIG. 4, along with the above-described drawings.

Figure 4:
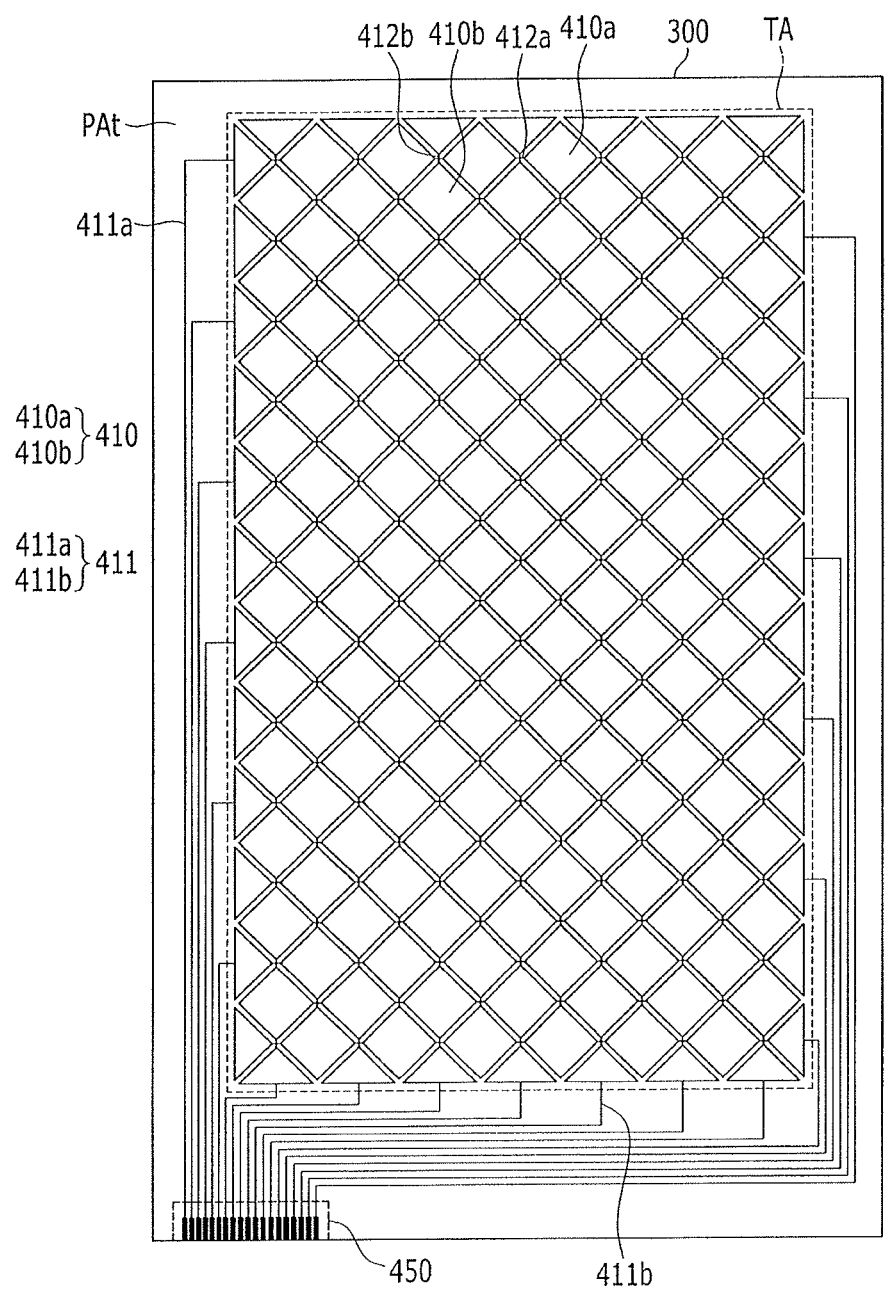
FIG. 4 illustrates a top plan view of a touch sensor of a display device according to an exemplary embodiment.

FIG. 4 illustrates a top plan view of a touch sensor of a display device according to an exemplary embodiment.

In the display device according to an exemplary embodiment, the pattern formed on the planarization layer 390 may, for example, configure the touch sensor. The display panel 300 of the display device may display the image and be a touch sensible display device sensing a touch.

Referring to FIG. 4 along with FIG. 1, the display panel 300 may include a touch sensible area TA as a region where the touch may be sensed and a touch peripheral area Pat positioned at the periphery thereof.

The touch sensible region TA may be the region where the touch may be sensed if an external object approaches the display panel 300 or contacts the touch surface on the display panel 300. The touch sensible region TA may overlap the display area DA. In an embodiment, the touch sensible region TA and the most of the display area DA may correspond to each other and the touch peripheral area Pat and most of the peripheral area PA may correspond to each other. In an embodiment, the portion of the peripheral area PA may be included in the touch sensible region TA, and the portion of the display area DA may only correspond to the touch sensible region TA.

The touch sensor may be positioned in the touch sensible region TA. The touch sensor may sense contact by various methods. For example, the touch sensor may be classified into various types such as, for example, a resistive type, a capacitive type, an electromagnetic (EM) type, or an optical type. In the current exemplary embodiment, a capacitance type of touch sensor will be exemplarily described.

Referring to FIG. 4, the touch sensor according to an exemplary embodiment may include the plurality of touch electrodes 410, and the plurality of touch electrodes 410 may include a plurality of first touch electrodes 410a and a plurality of second touch electrodes 410b. The plurality of first touch electrodes 410a and the plurality of second touch electrodes 410b may be alternately disposed and distributed to not overlap each other in the touch sensing area TA. The plurality of first touch electrodes 410a may be disposed along column and row directions and the plurality of second touch electrodes 410b may be disposed along the column and row directions. The first touch electrodes 410a and the second touch electrode 410b may be positioned in the same layer.

The plurality of first touch electrodes 410a arranged in the same row or column may be connected to or separated from each other inside or outside the touch sensing area TA. Similarly, at least some of the plurality of second touch electrodes 410b arranged in the same column or row may be connected to or separated from each other inside or outside the touch sensing area TA. For example, as shown in FIG. 4, when the plurality of first touch electrodes 410a arranged in the same row are connected to each other inside the touch active area TA, the plurality of second touch electrodes 410b arranged in the same column may be connected to each other inside the touch active area TA.

The plurality of first touch electrodes 410a positioned in each row may be connected to each other through first connecting portions 412a, while the plurality of second touch electrodes 410b positioned in each column may be connected to each other through second connecting portions 412b.

The touch electrode 410 may be connected to the touch wiring 411. The first touch electrodes 410b connected to each other in each row may be connected to a touch driver through first touch wires 411a, while the second touch electrodes 410b connected to each other in each column may be connected to the touch driver through second touch wires 411b. The first touch wiring 411a and the second touch wiring 411b may be disposed in the peripheral area PAt, as shown in FIG. 4. In an embodiment, the first touch wiring 411a and the second touch wiring 411b may be disposed in the touch sensible area TA.

Ends of the first touch wiring 411a and the second touch wiring 411b may form a pad 450 in the touch peripheral area PAt.

The first touch electrode 410a and the second touch electrode 410b may have at least a predetermined transmittance, and light may pass through the display panel 300. For example, the first touch electrode 410a and the second touch electrode 410b may be formed of a transparent conductive material, such as, for example, a thin metal layer including indium tin oxide (ITO), indium zinc oxide (IZO), and silver nano wire (AgNw), metal mesh, and carbon nano tube (CNT).

The first touch wiring 411a and the second touch wiring 411b may include the transparent conductive material included in the first touch electrode 410a and the second touch electrode 410b, or a low resistance material, such as molybdenum (Mo), silver (Ag), titanium (Ti), copper (Cu), aluminum (Al), and molybdenum/aluminum/molybdenum (Mo/Al/Mo).

The first touch electrode 410a and the second touch electrode 410b, which may be adjacent to each other, may form a mutual sensing capacitor that may serve as the touch detecting sensor. The mutual sensing capacitor may receive a detection input signal through one of the first touch electrode 410a and the second touch electrode 410b, and output a change in an amount of charge, for example, due to a touch by an external object, to the other touch electrode as a detection output signal.

The plurality of first touch electrodes 410a and the plurality of second touch electrodes 410b according to another exemplary embodiment may be separated from each other to be respectively connected with the touch controller 700 through touch wires. Each touch electrode may form a self sensing capacitor as the touch detecting sensor. The self sensing capacitor may receive the detection input signal and be charged with a predetermined charge amount, and when a touch by an external object, such as a finger, is generated, a charged charge amount may be changed, and the self sensing capacitor may output a detection output signal different from the input detection input signal.

Next, the display device according to an exemplary embodiment will be described with reference to FIG. 5 along with the above-described drawings.

Figure 5:
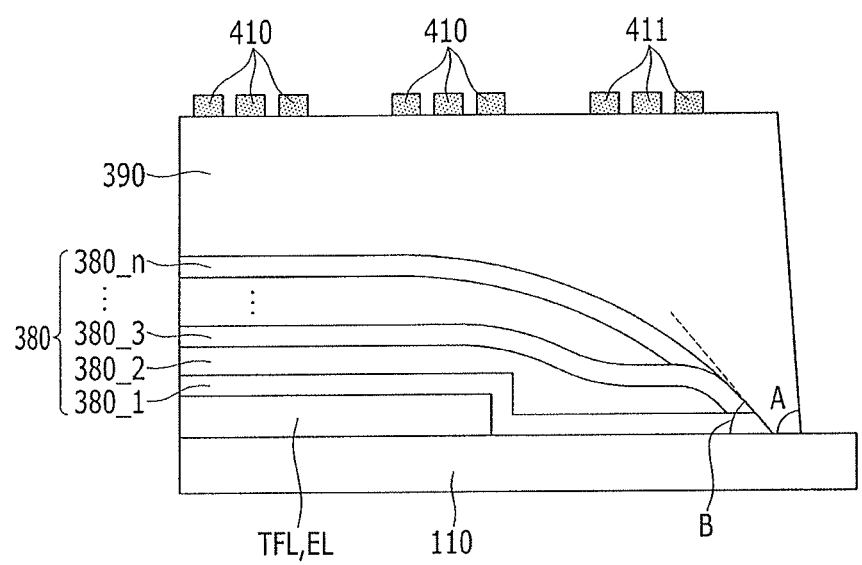
FIG. 5 illustrates a schematic cross-sectional view of a display device according to an exemplary embodiment.

FIG. 5 illustrates a schematic cross-sectional view of a display device according to an exemplary embodiment. Referring to FIG. 5, the display device according to the present exemplary embodiment may be substantially the same as the exemplary embodiment shown in FIG. 2 and FIG. 3, except for the edge side surface of the planarization layer 390. According to the present exemplary embodiment, the edge side surface of the planarization layer 390 may form a substantially flat surface and may form the angle A of more than about 70 degrees with the surface of the substrate 110. The edge side surface of the planarization layer 390 may be formed by cutting when elements such as the thin film transistor is formed on a mother substrate and the mother substrate is cell-cut into a display device unit during the manufacturing process of the display device. The edge side surface of the planarization layer 390 may not be covered by the separate inorganic layer to be exposed.

Next, the display device according to an exemplary embodiment will be described with reference to FIG. 6 and FIG. 7, along with FIG. 3.

Figure 6:
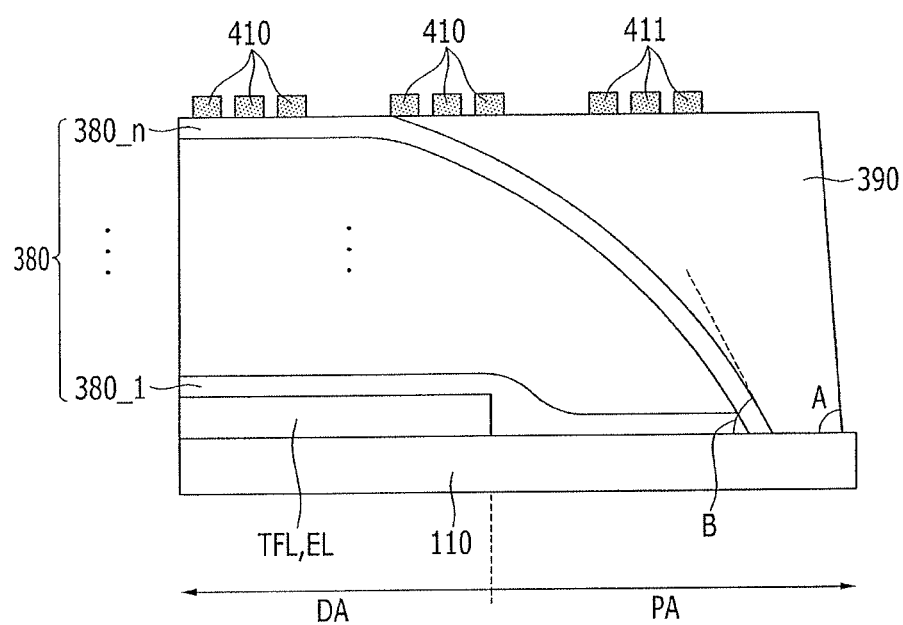
FIG. 6 illustrates a schematic cross-sectional view of a display device according to an exemplary embodiment.
Figure 7:
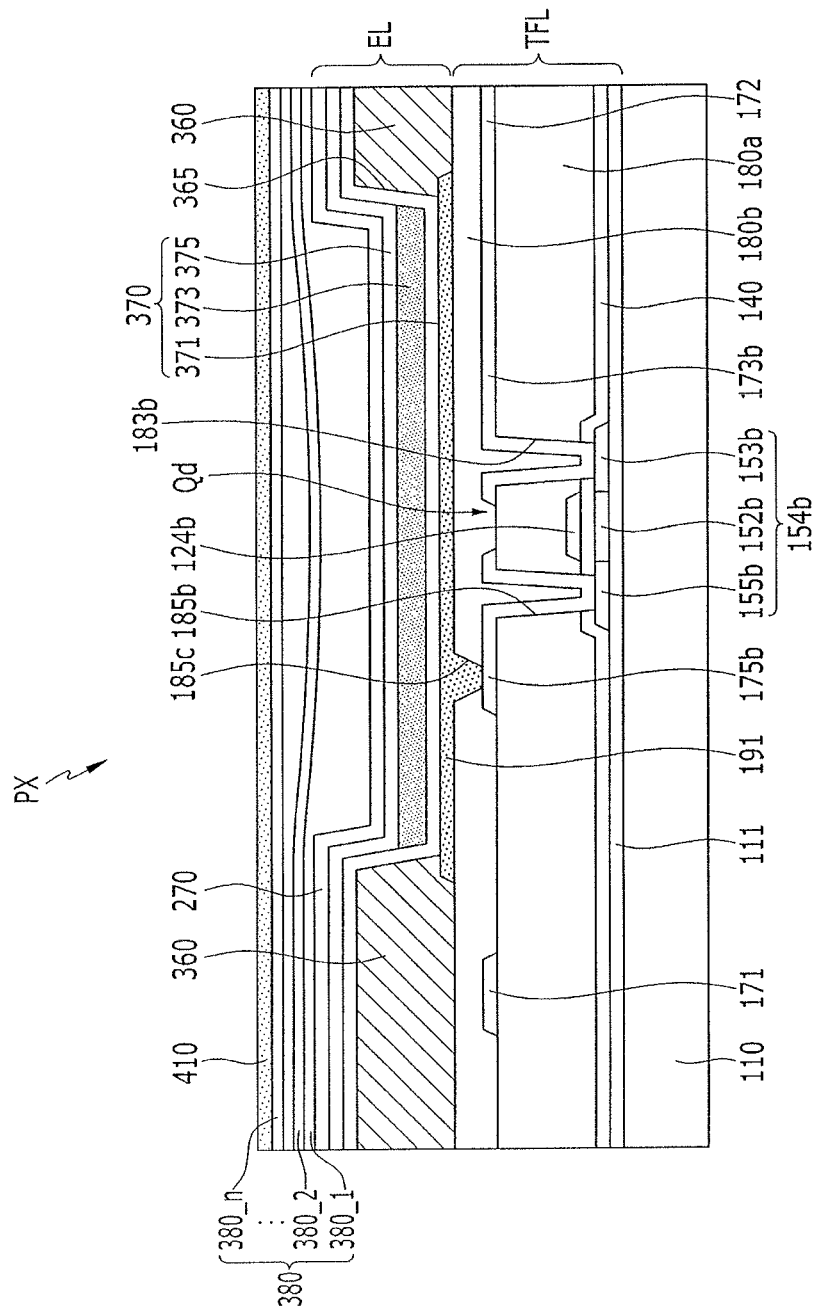
FIG. 7 illustrates a cross-sectional view of one pixel of a display device according to an exemplary embodiment.

FIG. 6 illustrates a schematic cross-sectional view of a display device according to an exemplary embodiment, and FIG. 7 illustrates a cross-sectional view of one pixel of a display device according to an exemplary embodiment. Referring to FIG. 6 and FIG. 7, the display device according to the present exemplary embodiment may be substantially the same as the exemplary embodiment shown in FIG. 2 and FIG. 3, except for the planarization layer 390.

According to the present exemplary embodiment, the planarization layer 390 may not be formed on the entire surface of the encapsulation portion 380, but may be formed on a portion thereof. The planarization layer 390 may expose a portion of the encapsulation portion 380. The planarization layer 390 may only include a portion covering the edge portion in which the height of the upper surface of the encapsulation portion 380 is gradually decreased. The planarization layer 390 may not be positioned in the inner region of the display area DA and may be mainly positioned in the peripheral area PA. As shown in FIG. 6, the planarization layer 390 may include a portion positioned at the edge region of the display area DA.

According to the present exemplary embodiment, the planarization layer 390 may cover the edge portion of the encapsulation portion 380, and the upper surface may be entirely flat. Accordingly, a pattern such as the touch sensor may also be formed on the planarization layer 390, and the area for forming the pattern may be widened and the area of dead space may be reduced.

Many features and effects of the exemplary embodiments described above may be equally applied to this exemplary embodiment.

By way of summation and review, if an external impurity such as moisture or oxygen inflows inside a display device, the life of an electric element included in the display device may be shortened, the light emission efficiency of an emission layer may be deteriorated in the case of the organic light emitting device, and deformation of the emission layer may occur.

An encapsulation process may be performed when manufacturing the display device to separate the electric element from the outside so that impurities such as moisture cannot penetrate the display device. This encapsulating process may use a method of laminating a layer made of an organic polymer such as PET or polyester on a lower substrate on which, for example, thin film transistors and an emission layer, are formed, a method of forming a cover or a cap as an encapsulating substrate and sealing the edges of the lower substrate and the encapsulating substrate using a sealant, or a method of forming an encapsulating part including the encapsulating thin film layers formed by depositing a plurality of thin films on the lower substrate instead of the encapsulating substrate.

In the method forming the encapsulating part including the plurality of encapsulating thin film layers, the encapsulating part may be formed by alternatively depositing a plurality of organic layers and inorganic layers on the completed lower substrate. The encapsulating thin film layers may have a high flexibility, and the encapsulating thin film layers may be applied more to flexible display devices.

Display devices may include a touch sensing function in which interaction with a user may be performed, in addition to a function of displaying the image. The touch sensing function may detect touch information, such as whether an object approaches or contacts a screen and a touch position thereof by sensing changes in, for example, pressure, charges, and light, applied to the screen by the display device, when the user writes text or draws figures by approaching or contacting a finger or a touch pen on the screen. The display device may receive an image signal based on the touch information to display an image.

Such a touch sensing function may be implemented through a touch sensor. The touch sensor may be classified into various types such as a resistive type, a capacitive type, an electro-magnetic (EM) type, and an optical type.

For example, the capacitive touch sensor may include a sensing capacitor formed by a sensing electrode which may transfer a sensing signal, and may sense a change in capacitance of the sensing capacitor generated when a conductor such as a finger approaches the touch sensor to determine existence of, for example, a touch or a touch position. The capacitive touch sensor may include a plurality of touch electrodes disposed in a touch sensing region that sense the touch and touch wiring connected to the touch electrodes. The touch wiring may transmit a sensing input signal to the touch electrode and transmit a sensing output signal of the touch electrode generated depending on the touch to a touch driver.

The touch sensor may be installed in the display device (an in-cell type), formed on an outer surface of the display device (an on-cell type), or attached to a separate touch sensor part of the display device (an add-on cell type).

When adhering the touch sensor part on the display device, additional processes for manufacturing the touch sensor part separately from the display panel and adhering the touch sensor part on the display device may be required, and yield may decrease and cost may increase. To adhere and fix the touch sensor part on the display device, an adhesive layer may be positioned between the touch sensor part and the display device or on the touch sensor part, and the thickness of the display device may increase. As transmittance may be deteriorated and reflectance may be increased by the adhered touch sensor part, haze may be increased, and on-cell type forming of the touch sensor on the outer surface of the display device may be used.

In the case of a display device including a plurality of encapsulating thin film layers, the touch sensor of an on-cell type may be formed on the encapsulating thin film layers. However, the encapsulating thin film layers may include a plurality of organic layers and inorganic layers, and the height of the edge portion of the encapsulating thin film layers may not be uniform and a height difference may occur. As described above, when forming a pattern such as the touch sensor on the encapsulating thin film layers with the non-uniform height, the pattern forming the touch electrode or the touch wiring configuring the touch sensor may be deteriorated. Accordingly, a region capable of forming the pattern of the touch sensor may be limited, and dead space incapable of sensing the touch in the peripheral area of the display device may be increased.

The thickness of the encapsulating thin film layers may be decreased in the peripheral area of the display device, in which the edge portion of the encapsulating thin film layers, and in this case, a parasitic capacitance (a noise capacitance) formed between the electrode (e.g., cathode) formed on the lower substrate and the touch electrode of the touch sensor or between the touch wirings may be increased. If the parasitic capacitance is increased, the characteristic of the touch sensor may be influenced. To prevent this, the touch sensor may only be formed in the region where the height of the top surface of the encapsulating thin film layers is uniformly maintained such that the area capable forming the pattern of the touch sensor may be reduced, and dead space may be further increased. This may also be the case for a display device in which the pattern that is not the touch sensor is formed on the encapsulating thin film layers.

To prevent the parasitic capacitance from being increased between the electrode on the lower substrate and the touch sensor, the thickness of the encapsulating thin film layers may be increased, but then the reflow amount of the organic layer included in the encapsulating thin film layers may be increased. However, since the organic layer may be easily exposed to the outside and moisture may penetrate through the exposed organic layer, the reliability of the display device may be deteriorated such that the area of the inorganic layer to cover the exposed organic layer may further be increased. As a result, dead space may further be increased and the size of the display device may also be increased.

Embodiments may provide a display device in which a pattern such as a touch sensor may be formed on the encapsulating thin film layers without increasing either dead space or the parasitic capacitance in the display device processed with the method of sealing the encapsulating thin film layers.

According to an exemplary embodiment, in the display device encapsulated by using the thin film encapsulating thin film layers, the pattern such as the touch sensor may be formed on the thin film encapsulating thin film layers without increasing dead space or increasing parasitic capacitance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate;
a transistor over the substrate;
a pixel electrode over the transistor and electrically coupled to the transistor;
an opposing electrode over the pixel electrode;
an encapsulation portion over the opposing electrode, the encapsulation portion including a first organic layer and a first inorganic layer; and
a second organic layer including a portion over and covering an edge portion of the encapsulation portion, wherein:
the encapsulation portion is between the substrate and the second organic layer,
a first angle between a lateral surface of the second organic layer and a bottom surface of the second organic layer is larger than a second angle between a lateral surface of the encapsulation portion and a bottom surface of the encapsulation portion, and
each of the first angle and the second angle is greater than 0 degrees and is not greater than 90 degrees.

2. The display device as claimed in claim 1, further comprising:
a plurality of touch electrodes in a touch sensible area of the substrate; and
a plurality of touch wires in a touch peripheral area of the substrate,
wherein the touch electrodes and the touch wires are over the second organic layer.

3. The display device as claimed in claim 2, wherein the edge portion of the encapsulation portion has an inclined surface approaching an edge of the substrate.

4. The display device as claimed in claim 3, wherein at least a portion of the plurality of touch wires overlaps the inclined surface of the encapsulation portion in a plan view.

5. The display device as claimed in claim 3, wherein the second organic layer is between the at least a portion of the plurality of touch wires and the inclined surface of the encapsulation portion in a sectional view.

6. The display device as claimed in claim 2, wherein:
the plurality of touch electrodes include first touch electrodes and second touch electrode,
the plurality of touch wires include a first set of touch wires at a first side of the touch sensible area and a second set of touch wires disposed at a second side, opposing the first side, of the touch sensible area,
the first touch electrodes are arranged in a plurality of rows,
the first set of touch wires are connected to odd-numbered rows of the plurality of rows, and
the second set of touch wires are connected to even-numbered rows of the plurality of rows.

7. The display device as claimed in claim 1, wherein an edge of the first organic layer included in the encapsulation portion is covered by the first inorganic layer.

8. The display device as claimed in claim 7, wherein the first angle is equal to or more than 70 degrees.

9. The display device as claimed in claim 8, wherein an upper surface of the second organic layer is substantially flat.

10. The display device as claimed in claim 9, wherein the edge portion of the encapsulation portion includes a region having an upper surface with a height that gradually decreases toward the substrate.

11. The display device as claimed in claim 10, wherein the lateral surface of the second organic layer includes a portion that is substantially curved.

12. The display device as claimed in claim 10, wherein the lateral surface of the second organic layer is substantially flat.

13. The display device as claimed in claim 10, wherein at least a portion of the encapsulation portion does not overlap the second organic layer in a direction perpendicular to a surface of the substrate.

14. The display device as claimed in claim 13, wherein:
an upper surface of the encapsulation portion is connected to the upper surface of the second organic layer, and
the upper surface of the encapsulation portion and the upper surface of the second organic layer together form a substantially flat upper surface.

15. The display device as claimed in claim 7, wherein the second organic layer contacts an upper surface of the first inorganic layer of the encapsulation portion.

16. The display device as claimed in claim 1, wherein the first angle is equal to or more than 70 degrees.

17. The display device as claimed in claim 1, further comprising a pattern on the second organic layer.

18. The display device as claimed in claim 1, wherein at least a portion of the encapsulation portion does not overlap the second organic layer in a direction perpendicular to a surface of the substrate.

19. A display device, comprising:
a substrate;
a transistor over the substrate;
a pixel electrode over the transistor and electrically coupled to the transistor;
an opposing electrode over the pixel electrode;
an encapsulation portion over the opposing electrode, the encapsulation portion including a first organic layer and a first inorganic layer;
a second organic layer including a portion over and covering an edge portion of the encapsulation portion;
a plurality of touch electrodes in a touch sensible area of the substrate and over the second organic layer; and
a plurality of touch wires in a touch peripheral area of the substrate and over the second organic layer,
wherein:
the encapsulation portion is between the substrate and the second organic layer,
the edge portion of the encapsulation portion has an inclined surface approaching an edge of the substrate,
at least a portion of the plurality of touch wires overlaps the inclined surface of the encapsulation portion in a plan view.

20. The display device as claimed in claim 19, wherein the second organic layer is interposed between the at least a portion of the plurality of touch wires and the inclined surface of the encapsulation portion in a sectional view.

* * * * *